US007488057B2

(12) United States Patent
Cho et al.

(10) Patent No.: US 7,488,057 B2

(45) Date of Patent: Feb. 10, 2009

(54) PIEZOELECTRIC INK JET PRINTER HEAD AND ITS MANUFACTURING PROCESS

(75) Inventors: Young June Cho, Yongin (KR); Chul Soo Byun, Seoul (KR); Moon Soo Park, Yongin (KR); Kyung Tae Kang, Seoul (KR); Young Seok Choi, Kwangmyung (KR); Il Yong Chung, Chunan (KR); Jaichan Lee, Seoul (KR)

(73) Assignees: Piezonics Co., Ltd., Chunan (KR); Korea Institute of Industrial Technology, Chunan (KR)

( * ) Notice: Subject to any disclaimer, the term of this patent is extended or adjusted under 35 U.S.C. 154(b) by 119 days.

(21) Appl. No.: 10/561,332

(22) PCT Filed: May 11, 2004

(86) PCT No.: PCT/KR2004/001080

§ 371 (c)(1), (2), (4) Date: Dec. 16, 2005

(87) PCT Pub. No.: WO2004/110768

PCT Pub. Date: Dec. 23, 2004

(65) Prior Publication Data

US 2006/0146098 A1 Jul. 6, 2006

(30) Foreign Application Priority Data

Jun. 17, 2003 (KR) ...................... 10-2003-0039048

(51) Int. Cl.
*B41J 2/045* (2006.01)
*H01L 41/22* (2006.01)

(52) U.S. Cl. ................. 347/68; 29/25.35; 257/E27.006

(58) Field of Classification Search .................. 347/68, 347/71, 70, 72, 20; 257/E27.06; 29/25.35
See application file for complete search history.

(56) References Cited

U.S. PATENT DOCUMENTS 5,748,214 A 5/1998 Usui et al.

(Continued)

*Primary Examiner*—Stephen D Meier
*Assistant Examiner*—Sarah Al-Hashimi
(74) *Attorney, Agent, or Firm*—Sherr & Vaughn, PLLC

(57) ABSTRACT

Disclosed is a piezoelectric ink jet printer head in which a chamber and an ink storage are integrally formed. A process for manufacturing the ink jet printer head is also disclosed. The ink jet printer head formed by laminating a plurality of plates includes: a) an actuator portion being composed of upper and lower electrodes, a piezoelectric plate inserted between the upper and lower electrodes, a protection layer placed on the upper electrode, and a resilient plate disposed beneath the lower electrode; b) an ink passage portion composed of a spacer disposed beneath the resilient plate and forming a side portion of a chamber, a channel plate disposed beneath the spacer, the channel plate forming an ink passage in one side of the chamber and simultaneously expanding the chamber, and a nozzle plate disposed beneath the channel plate, the nozzle plate forming the lower side of the chamber and having a nozzle communicating with the chamber; and c) an ink-supplying portion formed by a through-hole reaching the ink passage of the channel plate through the actuator portion and the spacer.

10 Claims, 3 Drawing Sheets

U.S. PATENT DOCUMENTS 6,217,161 B1 4/2001 Inose et al.
6,341,850 B1 1/2002 Sakai
6,918,660 B2 * 7/2005 Takahashi .................... 347/71
2002/0008743 A1 * 1/2002 Murai ......................... 347/71
2002/0036678 A1 * 3/2002 Ito et al. ....................... 347/71
2002/0130926 A1 * 9/2002 Yamada et al. ................ 347/55
2003/0011660 A1 * 1/2003 Nishi et al. ................... 347/68

* cited by examiner

PIEZOELECTRIC INK JET PRINTER HEAD AND ITS MANUFACTURING PROCESS

CROSS-REFERENCED APPLICATIONS

The present application claims priority under 35 U.S.C. 119 and 35 U.S.C. 365 to Korean Patent Application No. 10-2003-0039048 filed on Jun. 17, 2003 and PCT Application No. PCT/KR2004/001080 filed May 11, 2004, which are both hereby incorporated by reference in their entirety.

TECHNICAL FIELD

The present invention relates to a piezoelectric ink jet printer head and a process for manufacturing the same. Specifically, the invention relates to an ink jet printer head in which a chamber and an ink storage are integrally formed inside the ink jet printer head.

BACKGROUND ART

In general, the ink jet printing is carried out by discharging liquid ink on a print paper. In other words, the ink jet printer head is provided with arrayed nozzles each having a size of needle tip, from which the liquid ink is sprayed towards the print paper. Although the basic principle is same, the ink jet printing is categorized into a bubble jet type, a thermal jet type and a piezoelectric type according to the ink discharging mode.

In the bubble jet spraying type, a heater disposed on the side wall of a micro tube controls the size of bubbles in order to spray ink. That is, the heater is operated to generate bubbles, and then the ink is sprayed when the bubble is expanded to its maximum size. After spraying, if the heating is stopped, ink is newly supplied as the bubble is diminished. This type of ink jet printing is advantageous in that it does not need an ink storage and a small sized head can be realized since the tube and heater are very small. However, it is very difficult to array the nozzles in a two-dimensional pattern.

The thermal jet type is similar to the above-mentioned bubble jet, but the position of a heater is different therefrom. In this type, the heater is disposed on the same or opposite side of the nozzle, and when the heated ink is vaporized, the ink is sprayed due to the vapor pressure thereof. Therefore, one of the biggest advantages of this type resides in that the heater and nozzle can be arrayed in a two-dimensional pattern, and therefore, it is relatively easy to increase the number of nozzles.

In the piezoelectric spraying type, ink is discharged by an impact from behind a nozzle according to an input signal as in the conventional syringe operation. As the driving force for discharging ink, a piezoelectric element is employed, which changes its shape in response to voltage variation. Specifically, when a voltage is applied, the piezoelectric element is deformed and the liquid surface at the tip of the nozzle is swollen. Instantly, if the liquid surface is pulled back by controlling the voltage, then ink ahead of the nozzle face is sprayed forward due to its momentum.

Among the above-described types, the bubble jet and thermal jet types necessitate a relatively small space for the heater for generating the ink spraying force, as compared with the actuator in the piezoelectric spraying type. Furthermore, in the bubble and thermal jet types, an ink chamber and an ink storage may be disposed on the same plane so that the density of nozzles can be fairly increased. In contrast, the piezoelectric type has a disadvantage in that the number of nozzles or the nozzle density cannot be readily increased due to the complicated structure thereof.

FIG. 1 shows a schematic configuration of the conventional piezoelectric ink jet print head, which is exemplified by U.S. Pat. No. 5,748,214.

As depicted in FIG. 1, the conventional ink jet printer head is composed of a port for supplying ink (not shown), an ink storage 42 for storing the ink supplied through the port (not shown), a chamber 15 for receiving ink from the ink storage 42, a nozzle 21 for discharging ink from the chamber 15, and an actuator for exerting pressure to the chamber, i.e., the ink therein in order to discharge the ink through the nozzle 21 via a nozzle connection 20.

The above-mentioned actuator includes a resilient plate 13, a lower electrode 16 disposed on the resilient plate 13, a piezoelectric plate 17 disposed on the lower electrode 16, and an upper electrode 18 placed on the piezoelectric plate 17.

The chamber 15 is defined by the resilient plate 13 disposed thereabove, a spacer 12 placed in the side thereof, and a sealing plate 11 placed therebelow.

In addition, the ink storage 42 is constituted by an ink supplying plate 24 where upper through-holes 26 and 40 are formed, an ink storage forming plate 23 on the side thereof, and a nozzle plate 30 disposed therebelow. The nozzle for spraying ink is formed in the nozzle plate 30.

In operation, when an electric power is applied to the actuator, the piezoelectric plate 17 is deformed and exerts a pressure to the chamber 15, and thus, the ink inside the chamber 15 is discharged through the nozzle 21 due the pressure applied thereto.

On the other hand, U.S. Pat. No. 6,217,158B1 discloses an ink jet printer head similar to the above-described patent, except that it does not have the resilient plate disposed below the lower electrode.

The above-mentioned conventional ink jet printer heads embrace several problems and disadvantages. The conventional head necessitates a separate ink storage and, therefore, cannot use the space and area efficiently so an efficient arrangement of elements or components can be readily achieved. Also, this results in significant reduction in the number of nozzles, i.e., the nozzle density.

In addition, the nozzle portion is formed by laminating plural plates, and the ink storage must be included, together with the nozzle portion, in the structure formed by the lamination of plates. This causes a complexity in the fabricating process, and deteriorates its space efficiency.

Another drawback is caused by the fact that the cross section leading to the nozzle portion from the chamber is steeply changed. Therefore, it imposes an inevitable limitation in generating fine ink drops.

Furthermore, the ink-supplying path from the port to the chamber is disadvantageously bent, so that the ink bubbles (F) are apt to be trapped in the ink-supplying path.

DISCLOSURE OF INVENTION

It is an object of the present invention to provide an ink jet printer head, in which a chamber and ink storage are integrally formed, thereby enabling a simple structure of the ink jet printer head.

Another object of the invention is to provide an ink jet printer head, in which a nozzle is formed of a single plate so that the manufacturing process can be simplified, while improving the space efficiency.

A further object of the invention is to provide an ink jet printer head, in which the cross section leading to the nozzle from the chamber varies such that the amount of ink to be sprayed can be readily controlled, thereby allowing for the spraying of finer ink drops.

A further object of the invention is to provide an ink jet printer head, in which the ink is supplied directly to each individual chamber via each through-hole and ink passage provided in the side of the chamber, without necessity of a separate ink storage. Therefore, the space and area, which otherwise is occupied by a conventional ink storage, can be saved, and the actuator and nozzle portion are arrayed in a two-dimensional fashion, thereby increasing the number of nozzles, i.e., the nozzle density.

A further object of the invention is to provide an ink jet printer head, in which the ink is supplied directly to each individual chamber via each through-hole and ink passage provided in the side of the chamber. Therefore, the size of the chamber can be reduced and the ink passageway can be simplified, thereby significantly reducing the possibility of entrapping ink bubbles therein.

To accomplish the above objects, according to one aspect of the present invention, there is provided an ink jet printer head formed by laminating a plurality of plates. The ink jet printer head of the invention includes: (a) an actuator portion being composed of upper and lower electrodes, a piezoelectric plate interposed between the upper and lower electrodes, a protection layer placed on the upper electrode, and a resilient plate disposed beneath the lower electrode; (b) an ink passage portion composed of a spacer disposed beneath the resilient plate and forming a side portion of a chamber, a channel plate disposed beneath the spacer, the channel plate forming an ink passage in one side of the chamber and simultaneously expanding the chamber, and a nozzle plate disposed beneath the channel plate, the nozzle plate forming the lower side of the chamber and having a nozzle communicating with the chamber; and (c) an ink-supplying portion formed by a through-hole reaching the ink passage of the channel plate through the actuator portion and the spacer.

Here, preferably, a tapered portion is formed above the nozzle such that the cross section of the chamber varies from the chamber to the starting point of the nozzle.

The ink jet printer head is provided with an ink container above the protection layer. A plurality of ink jet head modules may be arrayed on a same plane in a matrix fashion, in which each module is composed of the actuator portion, the ink passage portion and the ink-supplying portion. The ink is supplied to the chamber of each ink jet head module from the ink container through each through-hole and ink passage. In the conventional piezoelectric ink jet printer head, only a 2×2 matrix arrangement is allowed, but in the invented ink jet printer head, various and unlimited number of rows and columns can be achieved without such limitation in the conventional one.

Furthermore, the resilient plate is formed of $ZrO_2$ having a good material property, or $BaTiO_3$ being easily formed in the shape of thin film. $Al_2O_3$ may also be employed.

According to another aspect of the invention, there is also provided a process for manufacturing a piezoelectric ink jet printer head, which is formed by laminating a plurality of plates including a resilient plate having elasticity, a nozzle plate having a nozzle, and the like. The process of the invention includes the steps of: (a) disposing a resilient plate; (b) printing a lower electrode on the resilient plate; (c) printing a spacer beneath the resilient plate; (d) printing a channel plate beneath the spacer; (e) sintering the assembly of the resilient plate, the lower electrode, the spacer and the channel plate; (f) forming a piezoelectric plate on the lower electrode; (g) forming an upper electrode on the piezoelectric plate; (h) forming a protection layer on the upper electrode; (i) forming a through-hole leading to the spacer from the protection layer; (j) forming a tapered portion in the nozzle plate; (k) forming a micro-spray hole at the apex of the tapered portion in the nozzle plate; and (l) bonding the nozzle plate and the channel plate to each other.

BRIEF DESCRIPTION OF DRAWINGS

Further objects and advantages of the invention can be more fully understood from the following detailed description taken in conjunction with the accompanying drawings in which.

BEST MODE FOR CARRYING OUT THE INVENTION

Referring to the accompanying drawings, the preferred embodiments according to the present invention are hereafter described in detail.

Figure 2:
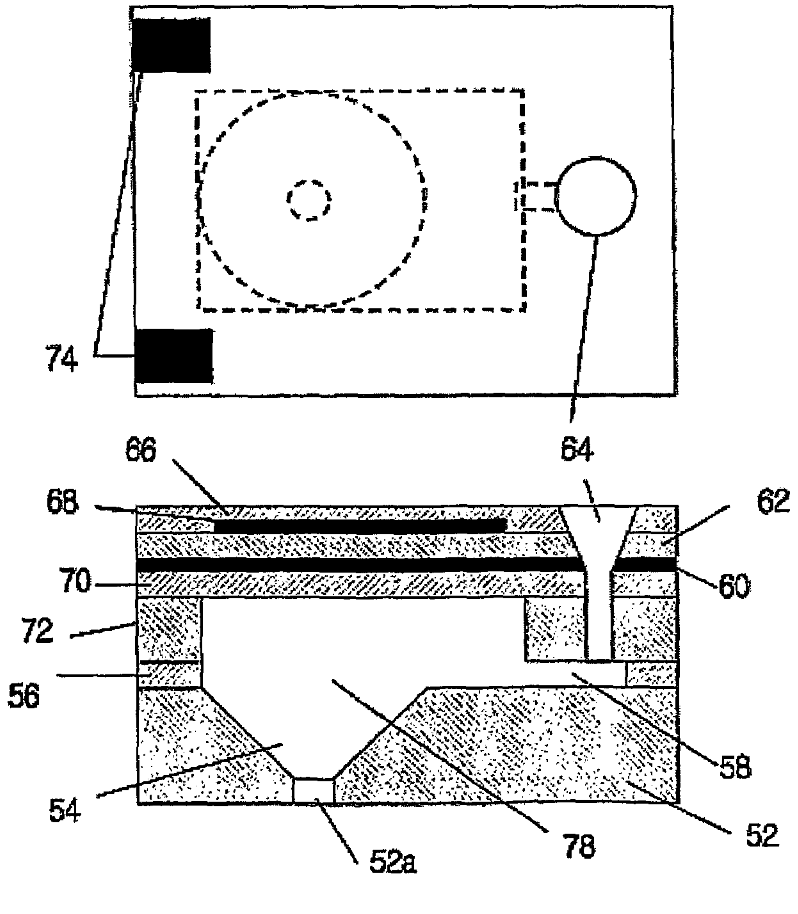
FIG. 2 is a top plan view and cross-sectional view of the ink jet printer head according to one embodiment of the invention.

FIG. 2 is a top plane view and cross-sectional view of the ink jet printer head according to one embodiment of the invention. Referring to FIG. 2, the ink jet printer head of the invention is composed of an ink passage portion for receiving ink and spraying it through a nozzle, and an actuator portion for exerting a pressure to the ink to discharge it through the nozzle, and an ink supplying portion for supplying ink through a through-hole.

The above-mentioned ink passage portion is constituted by a nozzle plate 52 disposed at the lowermost thereof, a channel plate 56 disposed on the nozzle plate 52, and a spacer 72 disposed on the channel plate 56.

The nozzle plate 52 is provided with a nozzle 52*a* formed fluid-communicatively in the upper and lower directions. A tapered portion 54 is formed at the upper part of the nozzle 52*a*.

The channel plate 56 is connected with the space 72 in the upper direction, and connected with the tapered portion 54 in the lower direction to thereby expand the internal space of the chamber 78. An ink passage 58 is formed at one side of the channel plate 56.

The actuator portion is composed of a resilient plate 70 disposed at the lower part thereof, a lower electrode 60 disposed on the resilient plate 70, a piezoelectric plate 62 disposed on the lower electrode 60, an upper electrode 68 on the piezoelectric plate 62, and a protection layer 66 formed on the upper electrode.

Here, the spacer 72 constituting the uppermost part of the ink-supplying portion is coupled with the resilient plate 70, i.e., the lowermost part of the actuator portion such that the chamber 78 is defined by the resilient plate 70 as an upper wall, the spacer 72 and the channel plate 56 as a side wall, and the nozzle plate 52 as a lower wall.

As shown in FIG. 2, the ink-supplying portion as described above is constituted by an ink container (not shown) provided at the upper part thereof for supplying ink to the chamber 78, and a through-hole 64, which is fluid-communicatively formed from the ink container (not shown) to the ink passage 58 through the actuator portion and the spacer 72.

On the other hand, the protection layer 66 is provided with an electrode pad 74 at one side thereof, through which an external control circuit (not shown) is electrically connected with the ink jet printer head of the invention.

Figure 1:
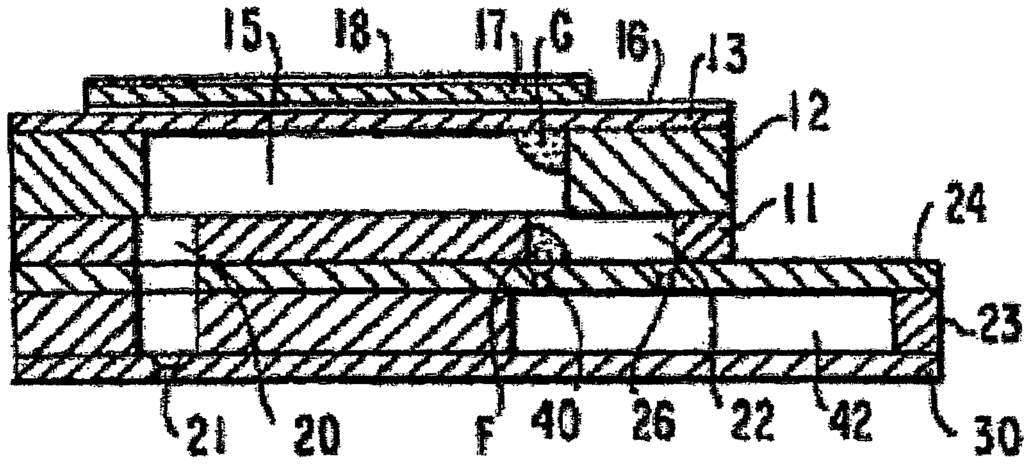
FIG. 1 shows a schematic configuration of the conventional piezoelectric ink jet print head.
Figure 3:
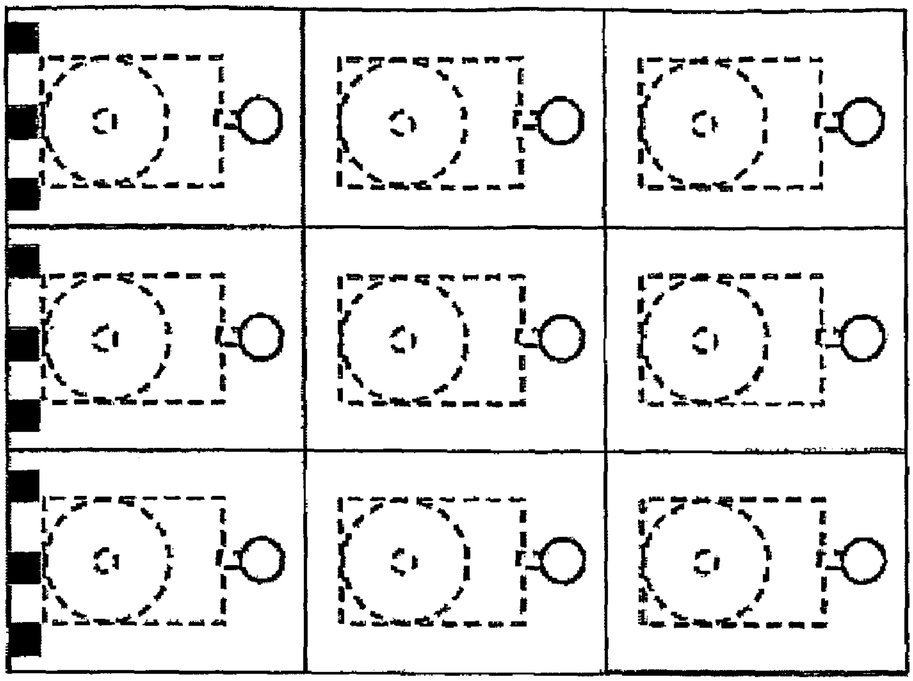
FIG. 3 is a top plan view and cross-sectional view illustrating an embodiment of the ink jet printer head arrangement according to the invention.
Figure 3:
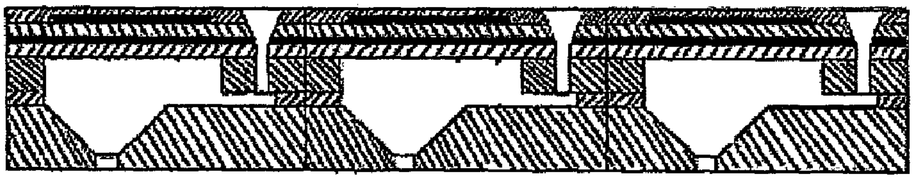

FIG. 3 is a top plan view and cross-sectional view illustrating an embodiment of the ink jet printer head arrangement according to the invention. Referring to FIG. 3, the ink jet printer head of the invention is composed of nine modules arrayed in the same plane in a 3×3 matrix pattern, in which each module is defined by the ink jet printer head illustrated in FIG. 2. A 3×3 matrix arrangement is illustrated in FIG. 1, but not limited thereto. For example, a 20×20 or 30×40 matrix pattern or the like may be achieved according to the present invention. With the conventional piezoelectric ink jet printer head, only a 2×2 matrix arrangement is allowed, but according to the invention, there is no limit. In other words, various and unlimited number of rows and columns can be achieved, depending on the design of the ink jet printer head.

Figure 4:
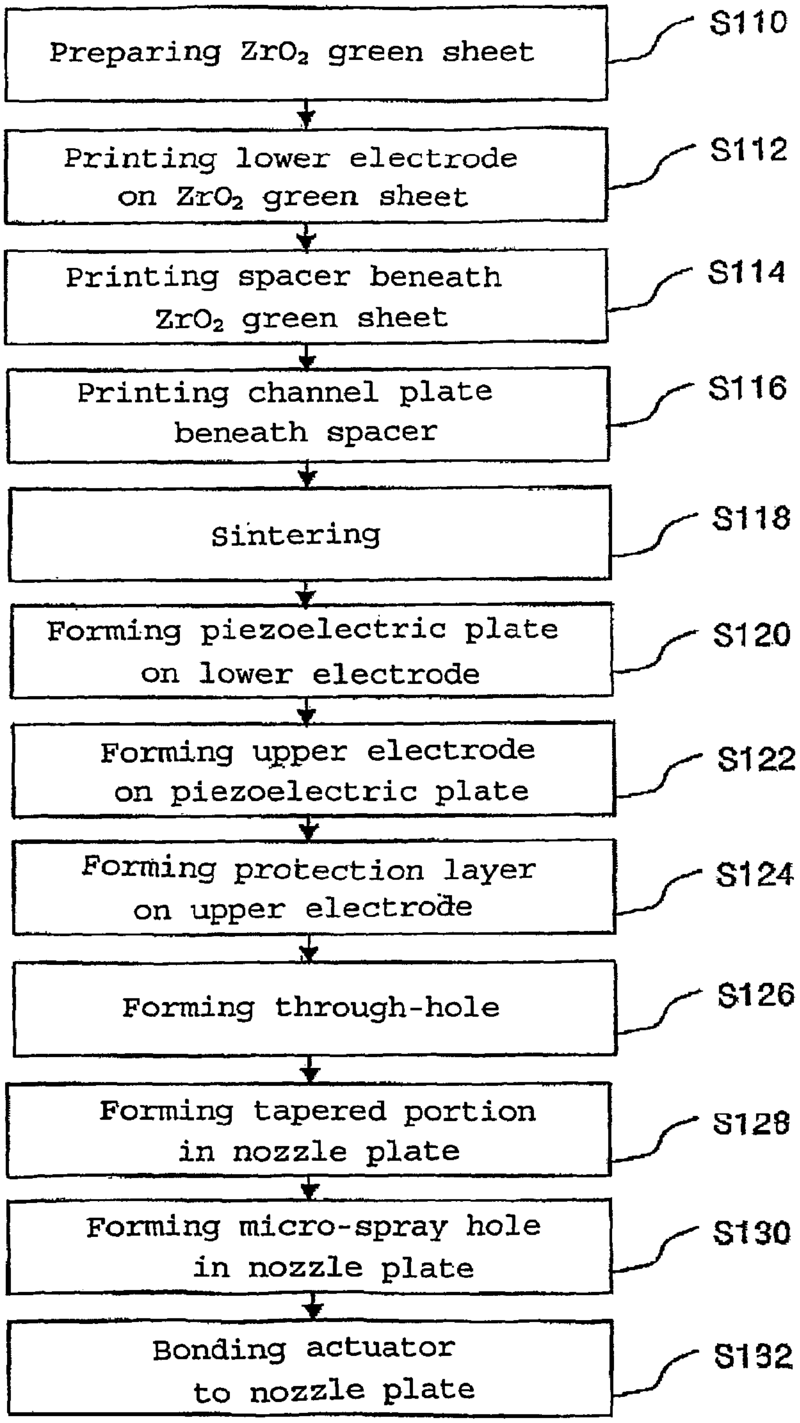
FIG. 4 is a block diagram showing a manufacturing process of the piezoelectric ink jet printer head according to one embodiment of the invention.

FIG. 4 is a block diagram showing a manufacturing process of the piezoelectric ink jet printer head according to one embodiment of the invention.

First, a $ZrO_2$ green sheet having a thickness of 3 μm is prepared and disposed by a tape-casting or a doctor-blade process (step S110). The $ZrO_2$ green sheet is employed as a resilient plate. As preferred materials for the resilient plate, $BaTiO_3$ and $Al_2O_3$ and the like may be employed, along with $ZrO_2$. The $BaTiO_3$ material can be easily made in the form of a thin film, and the $Al_2O_3$ material has good thermal characteristics. Next, a lower electrode is printed on the green sheet (step S112). Then, a spacer is printed in a thickness of 120 μm beneath the green sheet (step S114). After that, a channel plate is printed in a thickness of 40 μm beneath the spacer (step S116). The spacer and channel plate is preferably made of the same material as the resilient plate.

Next, the layered structure described above is sintered at 1200° C. in order to improve the rigidity and the bondability between layers.

Then, a piezoelectric plate having a thickness of 1.5-6 μm is formed on the lower electrode (step S120). The piezoelectric plate is preferably made of a PZT material. The piezoelectric plate may be formed employing a sputtering technique, a sol-gel method, or a metal organic chemical vapor deposition (MOCVD). In case of a piezoelectric plate having a thickness of above 2 μm, it has been found that the MOCVD is most preferred. On the other hand, a required portion of the piezoelectric plate may be etched in order for the lower electrode to be connected with an external control circuit (not shown).

Afterwards, an upper electrode is formed on the piezoelectric plate (step S122). The upper electrode may be formed using a sputtering technique, a metal organic chemical vapor deposition (MOCVD), a vaporization method or the like. On the other hand, by using an appropriate patterning process (for example, lithography, lift-off process), each actuator constituting the ink jet printer head can be separated and an electrode pad 74 may be formed in order to connect the external control circuit (not shown) thereto.

After forming the upper electrode, a protection layer is formed on the upper electrode (step S124). The protection layer may be formed by vapor-depositing $SiO_2$ using a chemical vapor deposition method (CVD). Then, in order to compensate for deterioration of the piezoelectric layer due to hydrogen, the piezoelectric layer may be heat-treated. On the other hand, a desired portion of the protection layer may be etched to expose the pad portion in the upper electrode to the outside. The protection layer functions to protect the actuator electrically and chemically from an ink solution, and an ink container (not shown) is installed right above the protection layer. In addition, appropriate sealing means for example, an o-ring having a resistance to the ink or an adhesive such as epoxy may be used. On the other hand, the ink container can contain ink or be provided with a port, through which ink can be supplied into the internal space thereof from an external ink container.

After completing the formation of the protection layer, a through-hole is formed which passes through the protection layer, the piezoelectric plate, the lower electrode, the resilient plate, and the spacer (step S126). The through-hole may be formed by means of a supersonic process, a micro-drilling method, a micro-blasting using an abrasive, or the like. Here, the diameter and depth of the through-hole are preferred to be 30 μm and should be under 150 μm, respectively.

Next, a tapered portion is formed in the nozzle plate (step S128). The nozzle plate is preferred to be formed of stainless steel or silicon material, and may be formed by means of a supersonic process, a micro-drilling, an anisotropic etching (in case of silicon material), or the like.

Thereafter, a micro-spray hole is formed at the tip of the above-formed tapered portion to constitute a nozzle (step S130). Preferably, a concentrated ion-beam may be used for forming the micro-spray hole.

In the final step, the nozzle plate is bonded to the channel plate using an adhesive (step S132). An elastic epoxy or the like is preferably used as the adhesive. When the bonding is completed, the process for manufacturing the ink jet printer head according to the invention is finished.

The operation of the ink jet printer head having the above-described construction according to the invention will be explained below.

First, ink is injected through the through-hole 64 formed at the upper portion of the ink jet printer head, and under its gravity, falls downwards to be collected in the chamber 78 via the ink passage 58.

The ink collected in the chamber 78 remains inside the chamber due to an attraction force between ink molecules, without discharging through the nozzle 52*a*.

Here, when an electric current is applied to the upper and lower electrodes 68, 60, the piezoelectric plate 62 is contracted. At this time, the resilient plate 70 attached to the piezoelectric plate 62 is deformed in a downwardly convex shape and thus exerts a pressure to the chamber.

Due to the pressure exerted to the chamber 78, the ink contained therein can be discharged and sprayed through the nozzle 52*a*, thereby carrying out a printing.

INDUSTRIAL APPLICABILITY

As described above, according to the piezoelectric ink jet printer head and its manufacturing process according to the invention, a chamber and ink storage are integrally formed inside the ink jet printer head, thereby enabling a simple structure of the ink jet printer head.

In addition, the nozzle is formed of a single plate so that the manufacturing process can be simplified, thereby reducing the manufacturing cost and also improving the space efficiency.

Furthermore, the cross section leading to the nozzle from the chamber varies such that the amount of ink to be sprayed can be readily controlled, thereby allowing for the spraying of finer ink drops.

Also, the ink is supplied directly to each individual chamber via each through-hole and ink passage provided in the side of the chamber, without necessity of a separate ink storage. Therefore, the space and area, which otherwise would be occupied by a conventional ink storage, can be insignificantly saved, and the actuator and nozzle portion are arrayed in a two-dimensional pattern, thereby increasing the number of nozzles, i.e., the nozzle density.

In addition, the ink is supplied directly to each individual chamber via each through-hole and ink passage provided in the side of the chamber. Therefore, the size of the chamber can be reduced and the ink passageway can be simplified, thereby significantly reducing the possibility of entrapping ink bubbles therein.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A piezoelectric ink jet printer head comprising:

an actuator comprising an upper upper electrode, a lower electrodes, a piezoelectric plate between the upper electrode and the lower electrodes, a protection layer over the upper electrode, and a resilient plate below the lower electrode;

a spacer below the resilient plate, wherein a first portion of the spacer forms sidewalls of a chamber and a second portion of the spacer an upper surface of an ink passage;

a channel plate below the spacer, wherein a first portion of the channel plate forms a sidewall of the ink passage under the second portion of the spacer and a second portion of the channel plate forms a sidewall of the chamber;

a nozzle plate below the channel plate, wherein a first portion of the nozzle plate forms a bottom surface of the chamber and a second portion of the nozzle plate forms a bottom surface of the ink passage;

a nozzle at a bottom portion of the chamber; and a through-hole formed through the actuator and the spacer reaching the ink passage, wherein the through-hole is configured to supply ink to the chamber via the ink passage.

2. The piezoelectric ink jet printer head according to claim 1, wherein the bottom portion of the chamber is tapered around the nozzle.

3. The piezoelectric ink jet printer head according to claim 1, comprising an ink container above the actuator, wherein the ink container is configured to supply ink to the chamber through the through-hole and the ink passage.

4. The piezoelectric ink jet printer head according to claim 1, wherein the resilient plate comprises $ZrO_2$.

5. The piezoelectric ink jet printer head according to claim 1, wherein the resilient plate comprises $BaTiO_3$.

6. The piezoelectric ink jet printer head according to claim 1, wherein the resilient plate comprises $Al_2O_3$.

7. The piezoelectric ink jet printer head according to claim 2, wherein the bottom portion of the chamber tapered around the nozzle to allow ink to flow down to the nozzle.

8. The piezoelectric ink jet printer head according to claim 3, wherein:

the piezoelectric printer head is comprised in a plurality of ink jet heads; and said plurality of ink jet heads are arranged in a matrix array in substantially the same plane; and each of said plurality of ink jet heads is configured to receive ink from the ink container.

9. The piezoelectric ink jet printer head according to claim 1, wherein an upper portion of the through-hole is tapered in the actuator.

10. The piezoelectric ink jet printer head accordingly to claim 1, wherein:

width of the upper electrode is less than width of the lower electrode; and the through-hole intersects the lower electrode; and the through hole does not intersect the upper electrode.

* * * * *